United States Patent
Imaizumi

(10) Patent No.: US 10,060,986 B2
(45) Date of Patent: *Aug. 28, 2018

(54) BATTERY REMAINING POWER PREDICTING DEVICE AND BATTERY PACK

(71) Applicant: ABLIC INC., Chiba-shi, Chiba (JP)

(72) Inventor: Eiki Imaizumi, Chiba (JP)

(73) Assignee: ABLIC INC., Chiba (JP)

( * ) Notice: Subject to any disclaimer, the term of this patent is extended or adjusted under 35 U.S.C. 154(b) by 140 days.

This patent is subject to a terminal disclaimer.

(21) Appl. No.: 15/059,833

(22) Filed: Mar. 3, 2016

(65) Prior Publication Data

US 2016/0266209 A1 Sep. 15, 2016

(30) Foreign Application Priority Data

Mar. 12, 2015 (JP) ................. 2015-049777

(51) Int. Cl.
*G01N 27/416* (2006.01)
*G01R 31/36* (2006.01)

(52) U.S. Cl.
CPC ...... *G01R 31/3624* (2013.01); *G01R 31/3651* (2013.01); *G01R 31/3662* (2013.01)

(58) Field of Classification Search
CPC .................................................. G01R 31/3648
USPC ......................................................... 324/426
See application file for complete search history.

(56) References Cited

U.S. PATENT DOCUMENTS

| | | | |
|---|---|---|---|
| 6,789,026 B2 | 9/2004 | Barsoukov et al. | |
| 6,891,355 B2* | 5/2005 | Kernahan | H02M 3/157 320/132 |
| 7,663,374 B2* | 2/2010 | Odaohhara | G01R 31/3648 320/132 |
| 8,200,444 B2* | 6/2012 | Vaingast | G01R 31/3648 324/428 |
| 8,643,331 B1* | 2/2014 | Wortham | G01R 31/3651 320/106 |
| 8,664,919 B2* | 3/2014 | Yamada | G01R 31/3644 320/132 |
| 2008/0255783 A1* | 10/2008 | Tamai | G01R 31/361 702/63 |
| 2010/0156351 A1* | 6/2010 | Ugaji | G01R 31/3679 320/132 |

* cited by examiner

*Primary Examiner* — Yalkew Fantu
(74) *Attorney, Agent, or Firm* — Brinks Gilson & Lione

(57) ABSTRACT

A battery remaining power predicting device predicts a remaining power of a battery by a first computing flow for regressively calculating a battery open circuit voltage and the battery remaining power, based on a battery voltage and a battery temperature both measured, and a current value and a battery internal resistance calculated from a change in the battery remaining power. Further, the battery remaining power predicting device predicts the remaining power of the battery by a second computing flow for calculating a battery capacity and a battery internal resistance, based on a battery remaining power before the start of a constant current discharge, a battery voltage immediately before the stop of the constant current discharge, and a settled battery voltage after the stop of the constant current discharge, after the constant current discharge is performed for a predetermined period as a battery load.

4 Claims, 5 Drawing Sheets

BATTERY REMAINING POWER PREDICTING DEVICE AND BATTERY PACK

RELATED APPLICATIONS

This application claims priority under 35 U.S.C. § 119 to Japanese Patent Application No. 2015-049777 filed on Mar. 12, 2015, the entire content of which is hereby incorporated by reference.

BACKGROUND OF THE INVENTION

Field of the Invention

The present invention relates to a battery pack, and particularly to a battery remaining power predicting device which predicts a battery remaining power of a lithium ion rechargeable battery or the like.

Background Art

A rechargeable battery has been used in a number of devices, starting with a portable device. A battery management system for managing charging/discharging is essential therefor. In particular, it is necessary to more accurately recognize the operation time of the battery during the device operation. To this end, a battery remaining power predicting device has been used.

A battery pack equipped with a related art battery remaining power predicting device is illustrated in FIG. 5. The related art battery remaining power predicting device 20 is equipped with a CPU 21 which performs a signal processing computation, a RAM 22 used upon the signal processing computation, an ADC 23 for detecting a battery voltage obtained by converting a battery voltage corresponding to one cell of a rechargeable battery 7 by a level translator 26, an ADC 24 for detecting a voltage developed across a current sense resistor 6 for detecting a current of the rechargeable battery 7, and a nonvolatile-memory 25 which holds characteristic data of the rechargeable battery, etc. therein in advance. The present battery remaining power predicting device determines the battery remaining power from the voltage of the rechargeable battery 7, a moving charge quantity determined by a coulomb counter from the current value of the rechargeable battery 7 measured using the current sense resistor 6, etc. The high accuracy measurement of the voltage and current of the rechargeable battery 7 is essential for a highly accurate remaining power prediction.

Paying particular attention to the current measurement, there is a demand for a highly accurate resistance value of the current sense resistor 6.

[Patent Document 1] U.S. Pat. No. 6,789,026 Specification

SUMMARY OF THE INVENTION

The battery pack equipped with the related art battery remaining power predicting device 20 needs the current sense resistor 6 high in accuracy and large in current allowable amount in order to perform a highly accurate battery remaining power prediction. The current sense resistor 6 was therefore accompanied by a problem that it was expensive and became larger in size.

A battery remaining power predicting device of the present invention is configured in the following manner to solve the above problems.

The battery remaining power predicting device predicts a remaining power of a battery by a first computing flow for regressively calculating a battery open circuit voltage and the battery remaining power, based on a battery voltage and a battery temperature both measured, and a current value and a battery internal resistance calculated from a change in the battery remaining power. Further, the battery remaining power predicting device predicts the remaining power of the battery by a second computing flow for calculating a battery capacity and a battery internal resistance, based on a battery remaining power before the start of a constant current discharge, a battery voltage immediately before the stop of the constant current discharge, and a settled battery voltage after the stop of the constant current discharge, after the constant current discharge is performed for a predetermined period as a battery load.

According to the battery remaining power predicting device of the present invention, since a highly accurate battery remaining power prediction is made possible based on a detected battery voltage, a current sense resistor becomes unnecessary. Thus, a battery pack can be provided in smaller size and at low cost.

DETAILED DESCRIPTION OF THE PREFERRED EMBODIMENTS

Figure 1:
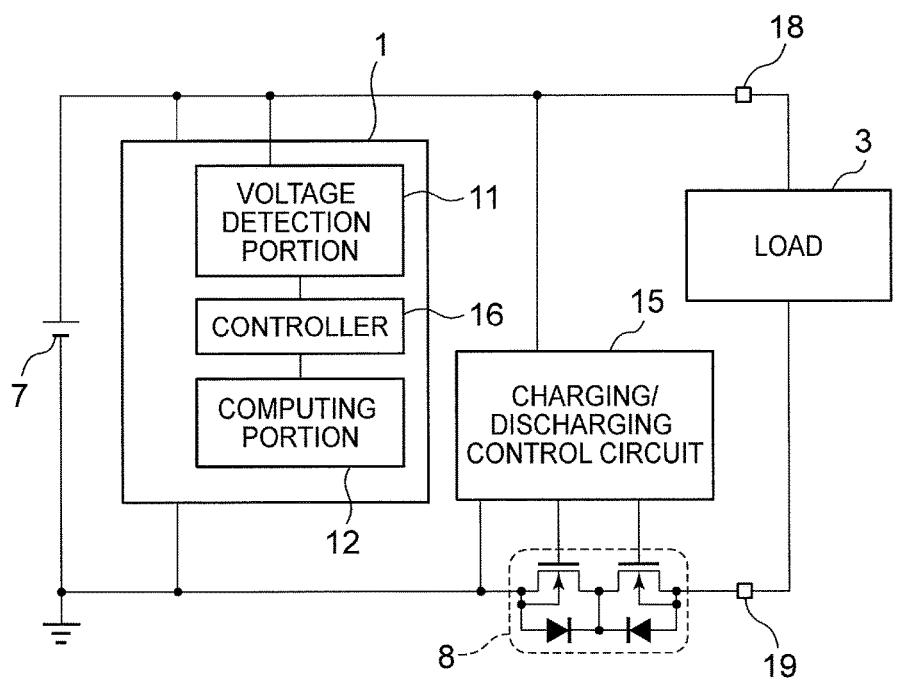
FIG. 1 is a block diagram of a battery pack equipped with a battery remaining power predicting device according to a first embodiment.

FIG. 1 is a block diagram of a battery pack equipped with a battery remaining power predicting device according to a first embodiment. The battery pack of the first embodiment is equipped with the battery remaining power predicting device 1, a rechargeable battery 7, a charging/discharging control MOSFET 8, a charging/discharging control circuit 15, and external terminals 18 and 19.

The battery remaining power predicting device 1 is equipped with a voltage detection portion 11, a controller 16, and a computing portion 12 which performs a remaining power prediction, etc.

The battery pack of the first embodiment is connected as follows.

The battery remaining power predicting device 1 is connected across the rechargeable battery 7. The MOSFET 8 is provided between the external terminal 19 and a negative electrode of the rechargeable battery 7. The charging/discharging control circuit 15 is connected across the rechargeable battery 7 and has an output terminal connected to the MOSFET 8. An application system which functions as a load 3 is connected to the external terminals 18 and 19. The voltage detection portion 11 has an input terminal to which a positive electrode of the rechargeable battery 7 is connected, and an output terminal connected to the controller 16. The controller 16 has an output terminal connected to the computing portion 12.

The voltage detection portion 11 detects a terminal voltage and a temperature of the rechargeable battery 7 and outputs the same to the controller 16. The controller 16 is equipped with, for example, a timer circuit, a storage device such as a RAM, a nonvolatile memory or the like. The computing portion 12 highly accurately predicts and calculates the battery remaining power of the rechargeable battery 7, based on information and control of the controller 16. That is, the battery remaining power predicting device 1 performs a highly accurate remaining power prediction computing flow illustrated in FIG. 2 and predicts and calculates the battery remaining power of the rechargeable battery 7 with high accuracy.

The battery remaining power predicting device according to the first embodiment is operated in the following manner and highly accurately predicts the battery remaining power of the rechargeable battery 7.

Figure 2:
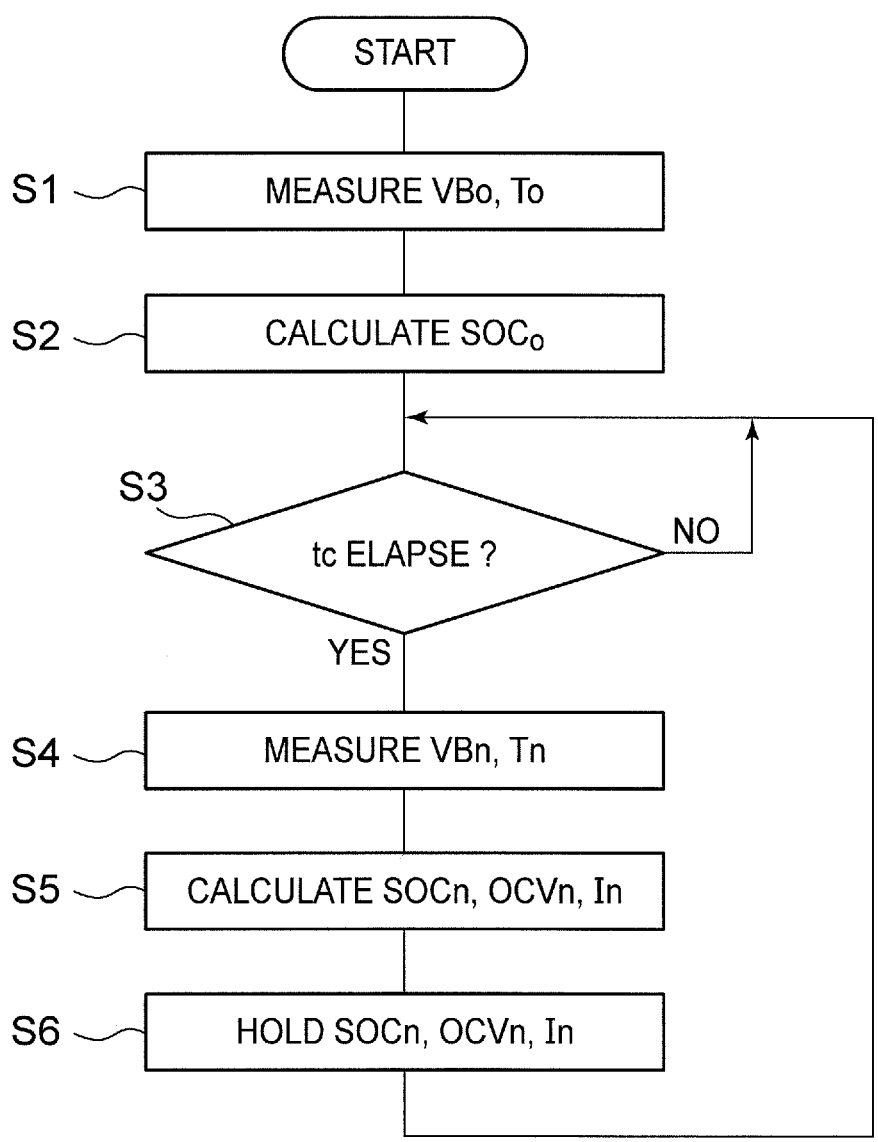
FIG. 2 is a battery remaining power prediction computing flow in the battery remaining power predicting device according to the first embodiment.

FIG. 2 is a battery remaining power prediction computing flow in the battery remaining power predicting device according to the first embodiment. In an initial state at the time of installation of the battery or the like, the battery remaining power of the rechargeable battery 7 is unknown. Thus, an initial value SOCo of the battery remaining power of the rechargeable battery 7 is calculated in Steps S1 and S2.

In Step S1, a battery terminal voltage VBo and a battery temperature To of the rechargeable battery 7 are detected by the voltage detection portion 11. Assuming that no current flows through the rechargeable battery 7, the battery terminal voltage VBo at this time is equal to a battery open circuit voltage OCV.

The battery open circuit voltage OCV, the battery remaining power (charging state) SOC, and the battery temperature T are in a predetermined relation depending on the type of battery. That relationship is expressed by an equation 1:

$$OCV = focv(SOC, T) \quad (1)$$

Since it is however difficult to represent focv (SOC, T) of the equation 1 by a function, focv (SOC, T) is defined by, for example, a numerical table obtained by measuring it in advance.

In Step S2, the initial value SOCo of the battery remaining power is calculated from the equation 1 assuming that the battery open circuit voltage is VBo, and the battery temperature To.

In Step S3, a time tc is counted. Then, battery remaining power prediction computations in Step S4 and after are executed for every time tc.

In Step S4, a battery terminal voltage VBn and a battery temperature Tn of the rechargeable battery 7 are detected by the voltage detection portion 11.

In Step S5, the present battery remaining power SOCn, open circuit voltage OCVn and battery current In are calculated from the last battery remaining power SOCn−1 and the battery voltage VBn and the battery temperature Tn both detected in Step S4.

As characteristics required to be defined as battery characteristics, there are known a battery internal impedance Rzb, and a battery capacity Qmax in addition to the characteristics assumed in the equation 1. These have intrinsic characteristics in the initial stage of manufacture. The internal impedance characteristic is assumed to be expressed in an equation 2:

$$Rzb = fzb(SOC, T) \quad (2)$$

Assuming that the battery current at this time is In, the battery terminal voltage VBn and the open circuit voltage at this time are represented by the following relational equation:

$$focv(SOCn, Tn) - VBn = In \cdot fzb(SOCn, Tn) \quad (3)$$

The equation 3 indicates that a difference voltage (left side) between the battery open circuit voltage focv (SOCn, Tn) and the battery terminal voltage VBn is equal to a voltage drop (right side) by the battery current In and the battery internal impedance fzb (SOCn, Tn). Considering the current In at this time as one obtained by dividing the quantity of movement of electric charges from before the time tc to the present time by the time tc, the current In can be expressed by an equation 4:

$$In = -(SOCn - SOCn-1) \cdot Qmax/tc \quad (4)$$

The numerator of the right side means a moving charge quantity in the form of the product of a change in the remaining power and a battery capacity Qmax. Incidentally, the current is set with the direction to output the same from the battery being made positive. The equations 3 and 4 are required to be established simultaneously and can be determined as the solutions of simultaneous equations with the battery current In and the remaining power SOCn as unknown variables. Thus, it is possible to predict the battery remaining power without actually measuring the battery current.

By carrying out the above computations in Step S5, the battery remaining power SOCn, the open circuit voltage OCVn focv (SOCn, Tn)), and the battery current In are respectively calculated. In Step S6, these calculated various values are written and held in the storage device such as the RAM, the non-volatile memory or the like. The remaining power is predicted by repeatedly executing the above steps S3 to S6.

According to the embodiment of the present invention as described above, the battery remaining power can be predicted without actually detecting the battery current. Thus, the high-accuracy current sense resistor which has heretofore been required for the detection of the battery current becomes unnecessary, and hence a reduction in cost and a reduction in mounting size can be realized.

Figure 3:
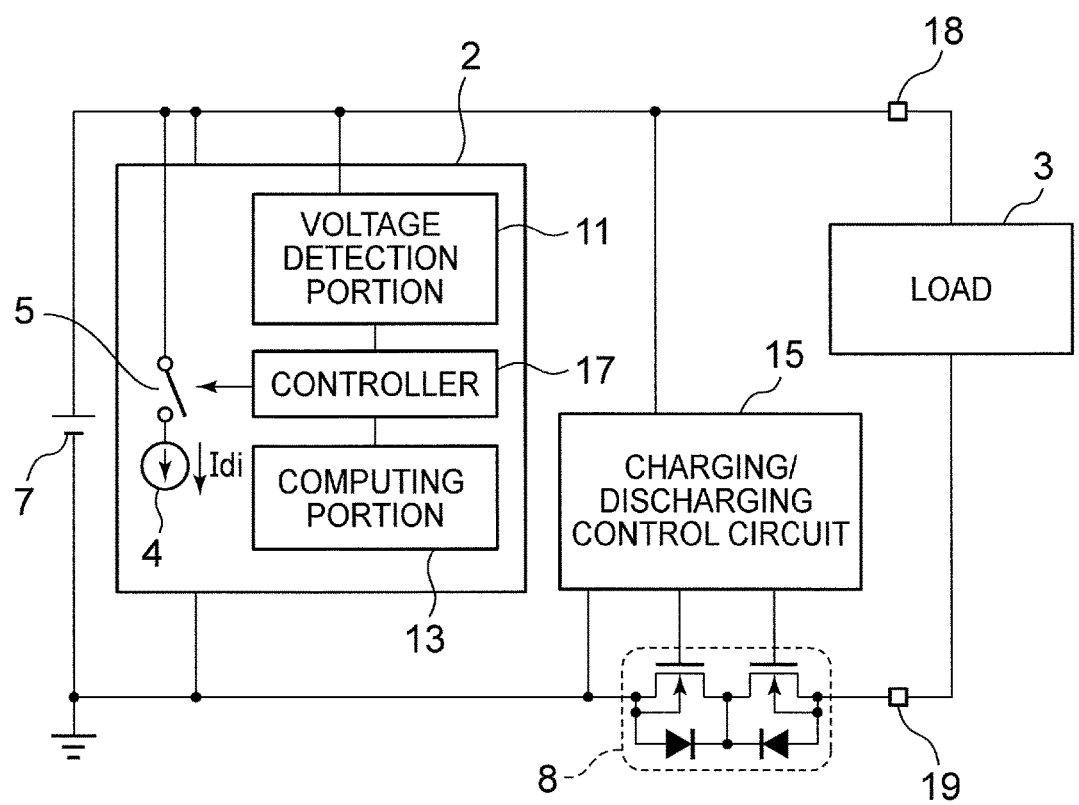
FIG. 3 is a block diagram of a battery pack equipped with a battery remaining power predicting device according to a second embodiment.

FIG. 3 is a block diagram illustrating another example of a battery pack equipped with a battery remaining power predicting device according to a second embodiment.

The remaining power predicting device 2 is equipped with a known constant current source 4 which functions as a battery load, and a switch 5. Further, the remaining power predicting device 2 is comprised of a controller 17 having a control function or the like of the switch 5 for ON/OFF-controlling the known constant current source, and a computing portion 13 which performs a remaining power prediction computation using ON/OFF information about the known constant current source too. The embodiment of the present invention aims to provide together means for predicting secular changes such as a reduction in the battery capacity and an increase in the battery internal impedance.

Figure 4:
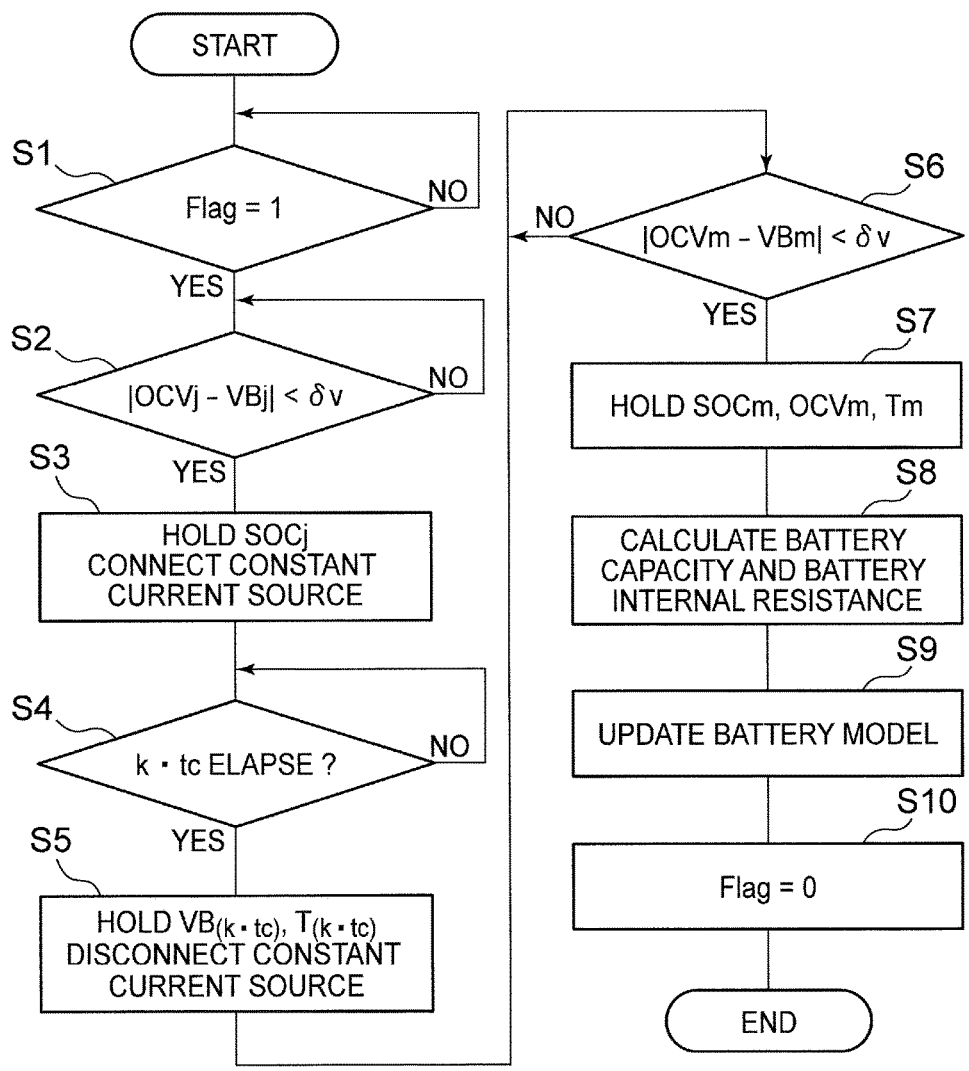
FIG. 4 is a battery characteristics prediction computing flow in the battery remaining power predicting device according to the second embodiment.
Figure 5:
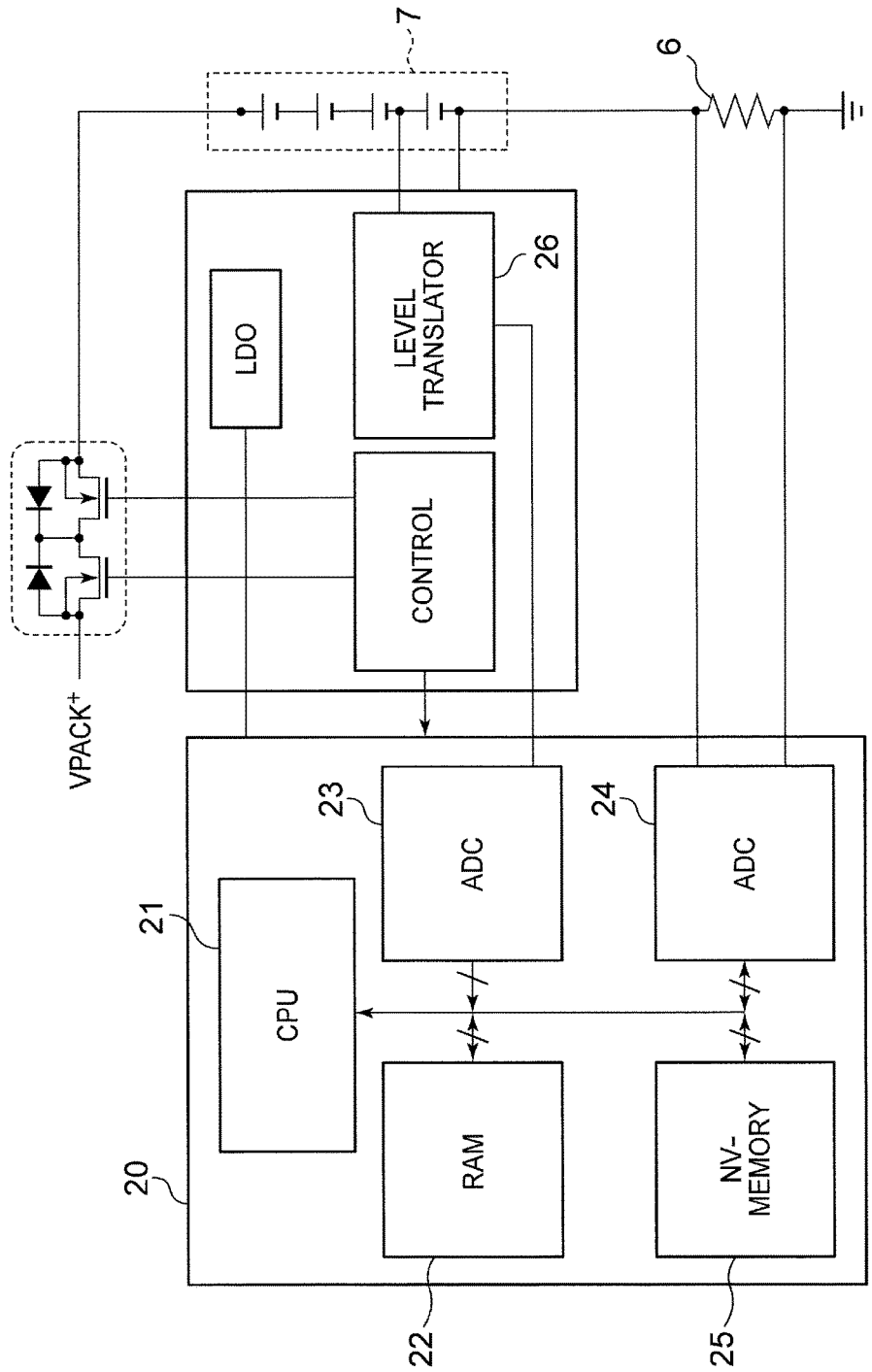
FIG. 5 is a block diagram of a battery pack equipped with a related art battery remaining power predicting device.

A computing flow for the prediction of the battery remaining power in the second embodiment includes a battery characteristics prediction computing flow illustrated in FIG. 4 in addition to the battery remaining power prediction computing flow illustrated in FIG. 2. The battery characteristics prediction computing flow is carried out in an ultra-low current consumption state such as an application system as a battery load being in a stop state or a sleep state, and in a state in which a battery current is smaller than a predetermined current, as the conditions for executing the battery characteristics prediction computing flow.

The battery characteristics prediction computing flow will be described below.

In Step S1, it is determined whether a battery characteristics prediction is executed. An execution flag Flag is monitored to determine whether the execution of the battery characteristics prediction is started, and the setting (Flag=1 in the present example) of the flag is detected to start a battery characteristics prediction computation.

In Step S2, the difference between an open circuit voltage OCVj calculated in the battery remaining power prediction computing flow and a detected battery terminal voltage VBj is determined. It is determined whether the difference is not greater than a predetermined voltage δv. When it is determined that the difference is not greater than the predetermined voltage, the battery remaining power prediction computing flow proceeds to the following Step S3.

In Step S3, a battery remaining power SOCj at the time that |OCVj−VBj|≤δv is reached is held in the storage device such as the RAM. Then, the known constant current source 4 provided in the remaining power predicting device 2 is connected as a load of a battery 7. The battery 7 is discharged with a constant current Idi through the constant current source 4.

When the elapse of a predetermined constant current discharge time (k·tc) is monitored and detected in Step S4, the battery remaining power prediction computing flow proceeds to Step S5.

In Step S5, a battery terminal voltage $VB_{(k\cdot tc)}$, and a battery temperature $T_{(k\cdot tc)}$ immediately before the stop of discharge are held in the storage device such as the RAM. Then, the known constant current source 4 is disconnected from the battery 7.

In Step S6, a difference voltage (=|OCVm−VBm|) between an open circuit voltage OCVm and a battery terminal voltage VBm after the disconnection of the constant current source 4 is monitored. It is determined whether the difference in voltage is not greater than a predetermined voltage δv2. When the difference in voltage is determined to be not greater than the predetermined voltage δv2, the battery remaining power prediction computing flow proceeds to Step S7.

In Step S7, the battery remaining power SOCm, open circuit voltage OCVm and battery temperature Tm at the time that the difference voltage becomes not greater than the predetermine voltage δv2 are held in the storage device such as the RAM.

In Step S8, the battery capacity and the battery internal impedance as the battery characteristics are calculated based on the battery remaining power SOCj, the value of the constant current Idi, the constant current discharge time k·tc, the battery terminal voltage $VB_{(k\cdot tc)}$, the battery temperature $T_{(k\cdot tc)}$, the battery remaining power SOCm, the open circuit voltage OCVm, and the battery temperature Tm. A battery characteristics calculating method in Step S8 will be described in detail below.

The calculation of the battery capacity will first be described.

The battery remaining powers before the start of constant current discharge by the constant current Idi and after its stop are respectively calculated as SOCj and SOCm. Since a change between the battery remaining powers is based on the movement of electric charges by the constant current discharge, the change yields an equation 5 assuming that the battery capacity is Qrmx:

$$Idi \cdot k \cdot tc = (SOCj - SOCm) \cdot Qrmx \quad (5)$$

The left side of the equation 5 indicates the quantity of the electric charges discharged with the constant current Idi and for the k·tc time and is assumed to be equal to the product of the change between the battery remaining powers at the right side of the equation 5, and the battery capacity. Thus, the battery capacity Qrmx after the secular change can be calculated as an equation 6:

$$Qrmx = Idi \cdot k \cdot tc / (SOCj - SOCm) \quad (6)$$

The calculation of the battery internal impedance will next be described.

Assuming that the battery terminal voltage immediately before the stop of the constant current discharge, is $VB_{(k\cdot tc)}$, the battery open circuit voltage at this time is $OCV_{(k\cdot tc)}$, and the battery internal impedance is Rz, a relationship therebetween is expressed in an equation 7:

$$OCV_{(k\cdot tc)} - VB_{(k\cdot tc)} = Idi \cdot Rz \quad (7)$$

The left side of the equation 7 indicates a difference voltage between the battery open circuit voltage and the battery terminal voltage. This difference voltage is assumed to be equal to a voltage drop by the constant current Idi and the battery internal impedance Rz.

Incidentally, the battery open circuit voltage $OCV_{(k\cdot tc)}$ immediately before the stop of the constant current discharge can be calculated as an equation 8 when the battery remaining power SOCm after the stop of the constant current discharge, the battery temperature $T_{(k\cdot tc)}$ immediately before the stop of the constant current discharge, and the dependent equation: OCV=focv (SOC, T) of the battery open circuit voltage OCV, the remaining power SOC, and the temperature T are used:

$$OCV_{(k\cdot tc)} = focv(SOCm, T_{(k\cdot tc)}) \quad (8)$$

The battery internal impedance Rz can be determined by an equation 9 from the equations 7 and 8:

$$Rz = (focv(SOCm, T_{(k\cdot tc)}) - VB_{(k\cdot tc)}) / Idi \quad (9)$$

In Step S9, the battery capacity and the battery internal impedance after the secular change, which have been determined in Step S8 are reflected on battery characteristic data used for the prediction of the battery remaining power.

In Step S10, the prediction execution flag Flag is reset (Flag=0 in the present example) with the completion of the battery characteristics prediction computation.

As described above, according to the battery remaining power predicting device of the second embodiment, since the secular change in the battery characteristics can also be predicted, a highly accurate remaining power prediction can permanently be carried out and can be realized without performing a current detection. Therefore, the related art current sense resistor is not necessary, and there are effects of a reduction in cost and a reduction in mounting size.

What is claimed is:

1. A battery remaining power predicting device, that measures a voltage of a battery to predict a remaining power of the battery, the device comprising:
   a voltage detection portion that measures the voltage of the battery and a temperature of the battery;
   a computing portion that predicts and calculates the remaining power of the battery without detecting a battery current, and based on the battery voltage and the battery temperature; and
   a controller that controls an operation of the battery remaining power predicting device and the computing portion, wherein the battery remaining power predicting device predicts the remaining power of the battery by a computing flow for regressively calculating a battery open circuit voltage, a battery remaining power, and a current value, based on the measured battery voltage and temperature, and a battery internal resistance calculated from a change in the battery remaining power, wherein the current value is calculated from the change in the battery remaining power and a maximum capacity of the battery.

2. A battery remaining power predicting device that measures a voltage of a battery to predict a remaining power of the battery, comprising:

a voltage detection portion that measures the voltage of the battery and a temperature of the battery;

a computing portion that predicts and calculates the remaining power of the battery without detecting a battery current, based on the battery voltage and the battery temperature;

a controller that controls an operation of the battery remaining power predicting device and the computing portion; and a constant current source that functions as a load of the battery, wherein the battery remaining power predicting device predicts the remaining power of the battery by a first computing flow for regressively calculating a battery open circuit voltage and a battery remaining power, based on the measured battery voltage and temperature and a current value and a battery internal resistance calculated from a change in the battery remaining power; and a second computing flow for calculating a battery capacity and a battery internal resistance, based on a battery remaining power before the start of a constant current discharge, a battery voltage immediately before the stop of the constant current discharge, and a settled battery voltage after the stop of the constant current discharge, after the constant current source is connected as the battery load and the constant current discharge is performed for a predetermined period, wherein current value is calculated from the change in the battery remaining power and a maximum capacity of the battery.

3. A battery pack comprising:

a battery and a MOSFET for load current control connected in series between first and second external terminals between which a load is connected;

a control circuit which is connected across the battery and monitors a state of the battery to control the MOSFET; and a battery remaining power predicting device according to claim 1 which is connected across the battery and predicts a remaining power of the battery.

4. A battery pack comprising:

a battery and a MOSFET for load current control connected in series between first and second external terminals between which a load is connected;

a control circuit which is connected across the battery and monitors a state of the battery to control the MOSFET; and a battery remaining power predicting device according to claim 2 which is connected across the battery and predicts a remaining power of the battery.

* * * * *